(12) United States Patent
Leach et al.

(10) Patent No.: US 8,576,970 B2
(45) Date of Patent: Nov. 5, 2013

(54) PHASE-LOCKED LOOP

(75) Inventors: Graham R. Leach, Swindon (GB); Gordon A. Wilson, Swindon (GB); Rolf Sundblad, Ljungsbro (SE)

(73) Assignee: CSR Technology Inc., Sunnyvale, CA (US)

( * ) Notice: Subject to any disclaimer, the term of this patent is extended or adjusted under 35 U.S.C. 154(b) by 183 days.

(21) Appl. No.: 13/063,286

(22) PCT Filed: Sep. 9, 2009

(86) PCT No.: PCT/EP2009/061709
§ 371 (c)(1),
(2), (4) Date: Jun. 16, 2011

(87) PCT Pub. No.: WO2010/029114
PCT Pub. Date: Mar. 18, 2010

(65) Prior Publication Data
US 2011/0243290 A1    Oct. 6, 2011

Related U.S. Application Data

(60) Provisional application No. 61/097,619, filed on Sep. 17, 2008.

(30) Foreign Application Priority Data

Sep. 11, 2008    (EP) ..................................... 08164139

(51) Int. Cl.
    *H03D 3/24*    (2006.01)
(52) U.S. Cl.
    USPC ........... 375/376; 375/375; 375/373; 375/371; 327/147; 327/148; 327/157; 327/158; 348/512; 348/540; 348/541; 348/536
(58) Field of Classification Search
    USPC .......... 375/376, 375, 374, 373, 371; 327/147, 327/148, 156, 157; 348/512, 540, 541, 536
    See application file for complete search history.

(56) References Cited

U.S. PATENT DOCUMENTS

| 4,504,800 | A | 3/1985 | Plouviez |
| 6,140,881 | A | 10/2000 | Kim |
| 6,856,205 | B1 | 2/2005 | Groe |
| 8,059,200 | B2 * | 11/2011 | Chen .............................. 348/536 |

FOREIGN PATENT DOCUMENTS

EP    0637876 A    2/1995

OTHER PUBLICATIONS

International Preliminary Report on Patentability and Written Opinion from corresponding International Application No. PCT/EP2009/061709 dated Mar. 24, 2011.

* cited by examiner

*Primary Examiner* — Phuong Phu
(74) *Attorney, Agent, or Firm* — Lando & Anastasi, LLP

(57) ABSTRACT

A PLL circuit (1a, 1b) for generating a pixel-clock signal based on a hsync signal. The PLL circuit comprises a phase-frequency detector arranged to receive the hsync signal and a frequency divided pixel-clock signal, and generate up and down signals based on the hsync signal and the frequency-divided pixel-clock signal. A charge pump (20) is arranged to generate an output signal based on the up and down signals and a loop filter (30) is arranged to generate a frequency-control signal based on the output signal of the charge pump (20). Furthermore, a VCO (40a, 40b) is arranged to generate an oscillating signal and adjust the frequency of the oscillating signal in response to the frequency-control signal. The VCO (40a, 40b) is adapted to have a tuning range with a center frequency which is larger than or equal to 4 GHz. A programmable first frequency divider (50) is arranged to generate the pixel-clock signal by frequency division of the oscillating signal, and a programmable second frequency divider (60) is arranged to generate the frequency divided pixel-clock signal by frequency division of the pixel-clock signal.

20 Claims, 2 Drawing Sheets

PHASE-LOCKED LOOP

TECHNICAL FIELD

The present invention relates to a phase-locked loop circuit. More particularly, the present invention relates to a phase-locked loop circuit for video applications.

BACKGROUND

A phase-locked loop (PLL) circuit may be used for generating an output clock signal which is synchronized with a reference clock signal. Typically, the output clock signal is generated with a voltage-controlled oscillator (VCO) and may have a target frequency that is higher than the frequency of the reference clock signal. A frequency divider may be used for generating a frequency-divided clock signal, which has a target frequency that is equal to the reference clock frequency. The frequency-divided clock signal and the reference clock signal are input to a phase-frequency detector that generates "up" and "down" signals, for increasing and decreasing the frequency of the output clock signal, respectively. A charge pump and a loop filter are used for generating a control voltage for the VCO based on the up and down signals.

In video applications, a pixel-clock signal may be needed, e.g. as a sampling clock for sampling R (Red), G (Green), and B (Blue) signals in a front-end sampling circuit of a computer monitor, liquid crystal display (LCD) TV, or the like. The pixel-clock signal is generated based on a horizontal sync (hsync) signal. An hsync pulse is generated to indicate the beginning of each row of pixels of a screen. Normally, the pixel-clock signal has a frequency that is much higher than that of the hsync signal, for example with a factor between 256 and 4096, or even higher. If a PLL is used for generating the pixel-clock signal with the hsync signal as a reference signal, this means that the VCO is running freely for many clock periods between each update of the control voltage. Jitter, or phase noise, of the VCO then may become a limiting factor for the accuracy of the pixel-clock signal.

For flexibility, a wide variety of pixel-clock frequencies may be desired, e.g. to cope with a wide variety of screen resolutions and refresh rates. For example, in some applications, pixel-clock frequencies may vary between approximately 13.5 MHz and 300 MHz, or even higher. Hence, a large frequency tuning range may be needed.

Low phase noise and large tuning range are to some extent contradictory requirements; an oscillator that has a large tuning range normally has worse phase noise than an oscillator with a small tuning range.

One approach, as e.g. disclosed in U.S. Pat. No. 6,078,317, is to use several VCOs, e.g. one for each screen resolution. However, this approach is inefficient e.g. in that requires an excessively large circuit area as the number of different screen resolutions, and therefore the number of VCOs, increases.

In view of the above, there is a need for a clock-generation circuitry for generating a pixel-clock signal with low phase noise and large frequency tuning range.

SUMMARY

Accordingly, an object of the present invention is to mitigate, alleviate or eliminate one or more of the above-identified deficiencies and disadvantages singly or in any combination.

According to a first aspect, there is provided a phase-locked loop (PLL) circuit for generating a pixel-clock signal based on a horizontal sync (hsync) signal. The PLL circuit comprises a phase-frequency detector arranged to receive the hsync signal and a frequency divided pixel-clock signal, and generate up and down signals based on the hsync signal and the frequency-divided pixel-clock signal. Furthermore, the PLL circuit comprises a charge pump arranged to generate an output signal based on the up and down signals and a loop filter arranged to generate a frequency-control signal based on the output signal of the charge pump. A voltage-controlled oscillator (VCO) of the PLL circuit is arranged to generate an oscillating signal and adjust the frequency of the oscillating signal in response to the frequency-control signal. The VCO is adapted to have a tuning range with a center frequency that is larger than or equal to 4 GHz. Moreover, the PLL circuit comprises a programmable first frequency divider arranged to generate the pixel-clock signal by frequency division of the oscillating signal and a programmable second frequency divider arranged to generate the frequency divided pixel-clock signal by frequency division of the pixel-clock signal.

The VCO may be an LC-tank VCO. Furthermore, The VCO may comprise a first capacitor, an inductor, and a varactor diode. The varactor diode may be responsive to the frequency-control signal for adjusting the frequency of the oscillating signal. Moreover, the VCO may comprise one or more switchable capacitors arranged to be selectively connected in parallel with the first capacitor based on a calibration signal for calibrating the tuning range of the VCO.

The PLL circuit may comprise a calibration unit adapted to detect, based on the frequency-control signal, if a target frequency of the oscillating signal is outside the tuning range of the voltage-controlled oscillator and, in response thereto, generate the calibration signal for calibrating the tuning range of the VCO.

The tuning range of the voltage-controlled oscillator may comprise the frequency 5 GHz. Furthermore, the programmable first frequency divider may be adapted to be programmed to perform frequency division with even frequency divisors between and including 16 and 370.

According to a second aspect, a video front-end sampling circuit comprises a PLL circuit according to the first aspect.

According to a third aspect, an integrated circuit comprises a PLL circuit according to the first aspect.

According to a fourth aspect, an electronic apparatus comprises a PLL circuit according to the first aspect. The electronic apparatus may e.g. be, but is not limited to, a television set, a liquid-crystal display, a computer monitor, or a projector.

It is an advantage of embodiments of the present invention that generation of a pixel-clock signal with relatively low jitter in combination with a relatively large tuning range is facilitated.

It should be emphasized that the term "comprises/comprising" when used in this specification is taken to specify the presence of stated features, integers, steps, or components, but does not preclude the presence or addition of one or more other features, integers, steps, components, or groups thereof.

BRIEF DESCRIPTION OF THE DRAWINGS

Further objects, features and advantages of the invention will appear from the following detailed description of the invention, reference being made to the accompanying drawings, in which.

DETAILED DESCRIPTION

Figure 1:
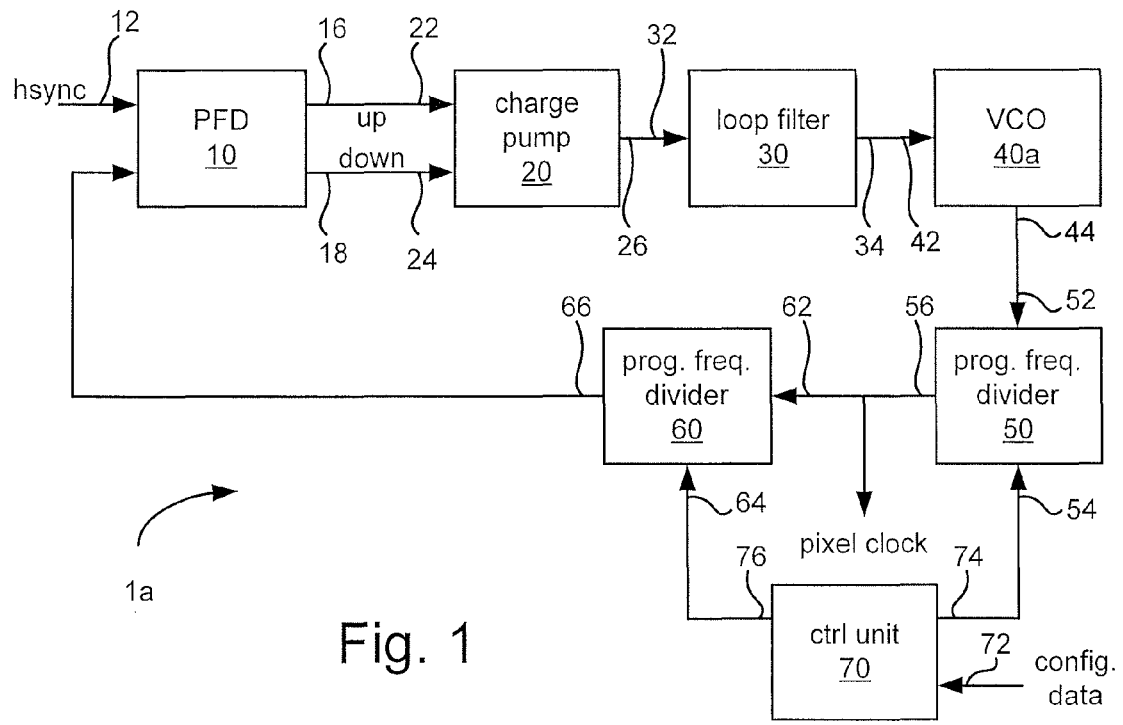
FIG. 1 is a block diagram of a phase-locked loop circuit according to an embodiment.

FIG. 1 is a block diagram of a phase-locked loop (PLL) circuit 1a for generating a pixel-clock signal based on a horizontal sync (hsync) signal according to an embodiment. According to the embodiment, the PLL circuit 1a comprises a phase-frequency detector (PFD) 10 having input terminals 12 and 14 and output terminals 16 and 18. The PFD 10 is arranged to receive the hsync signal on the input terminal 12. Furthermore, the PFD is arranged to receive a frequency divided pixel-clock signal on the input terminal 14. The frequency-divided pixel-clock signal is generated by frequency division of the pixel-clock signal. The target frequency of the frequency-divided pixel-clock signal is the frequency of the hsync signal. The PFD 10 is adapted to generate "up" and "down" signals on the output terminals 16 and 18, respectively, based on the hsync signal and the frequency-divided pixel-clock signal. For example, if the frequency-divided pixel-clock signal leads, or is ahead of, the hsync signal, a pulse (in the following referred to as a down pulse) is generated on the output terminal 18. If, instead, the frequency-divided pixel-clock signal lags, or is behind of, the hsync signal, a pulse (in the following referred to as an up pulse) is generated on the output terminal 16. PFDs are known in the art and details thereof will not be further discussed herein.

Furthermore, according to the embodiment illustrated in FIG. 1, the PLL circuit 1a comprises a charge pump 20, having input terminals 22 and 24 and an output terminal 26. The input terminals 22 and 24 are operatively connected to the output terminals 16 and 18, respectively, of the PFD 10. The charge pump 20 is arranged to generate an output signal based on the up and down signals. For example, the charge pump may be adapted to generate a positive current for charging capacitance associated with the output terminal during an up pulse and a negative current for discharging said capacitance during a down pulse. The charge pump 20 is illustrated in FIG. 1 as having a single-ended output. However, according to some embodiments, the charge pump 20 may have a differential output with complementary output terminals.

Moreover, according to the embodiment illustrated in FIG. 1, the PLL circuit 1a comprises a loop filter 30 having an input terminal 32 and an output terminal 34. The loop filter 30 may e.g. be an active or a passive filter. The input terminal 32 is operatively connected to the output terminal 26 of the charge pump. The loop filter 30 is arranged to generate a frequency-control signal on the output terminal 34 based on the output signal of the charge pump 20. Even though the input and output terminals 32 and 34 are indicated as separate terminals in FIG. 1, they may, according to some embodiments, be represented with the same physical node. For example, the loop filter 30 may be embodied with a passive circuit (not shown) having a certain impedance connected between the output terminal 26 of the charge pump 20 and a reference potential, such as but not limited to ground. The input signal to the loop filter may be a current injected from the charge pump 20 into said passive circuit, and the output signal from the loop filter may be a resulting voltage across said passive circuit. The passive circuit may e.g. comprise a series connection of a resistor and a first capacitor connected between the output terminal 26 of the charge pump 20 and the reference potential. The passive circuit may further comprise a second capacitor connected in parallel with said series connection. Charge pumps and loop filters are known in the art and details thereof will not be further discussed herein.

According to the embodiment illustrated in FIG. 1, the PLL circuit 1 comprises a voltage-controlled oscillator (VCO) 40a having a control terminal 42 and an output terminal 44. The control terminal 42 is operatively connected to the output terminal 34 of the loop filter 30. The VCO 40a is arranged to generate an oscillating signal on the output terminal 44. Furthermore, the VCO 40a is arranged to adjust the frequency of oscillating signal in response to the frequency-control signal. According to embodiments of the present invention, a VCO 40a with a relatively high Q (Quality) value is employed. Thereby, a VCO 40a with a relatively stable free-running frequency is obtained. Hence, the oscillating signal generated by the VCO 40a has a relatively small amount of jitter.

The jitter requirements, and consequently the Q value requirements, for generation of a pixel-clock signal based on an hsync signal may e.g. depend on the screen resolution (e.g. number of pixels per row) and/or the color depth. According to some embodiments, the VCO 40a has a Q value of 5 or higher, which may provide sufficiently low jitter for 10-bit resolution for all commonly used pixel-clock frequencies e.g. in the range 13.5 MHz-300 MHz.

According to embodiments, a relatively high Q value is obtained by means of a VCO that has a center frequency (i.e. frequency in the center of the tuning range of the VCO), which is significantly higher than the pixel-clock frequency, which depends on the currently used screen resolution and screen refresh rate and may e.g. be in the range 13.5 MHz-300 MHz. According to some embodiments, the center frequency is 4 GHz or higher. Hence, if, for example, the highest pixel-clock frequency to be generated is 300 MHz, the center frequency of the VCO is at least approximately a factor 13 higher than the highest pixel-clock frequency in these embodiments. By selection of a center frequency in this range, a VCO with a relatively high Q value (such as 5 or higher) may be implemented with a standard integrated-circuit (IC) fabrication process. Such high Q values may also be obtained at lower frequencies, e.g. in the order of 1 GHz. However, in order to so with existing manufacturing technology, additional manufacturing steps are normally required to reduce losses in inductors, which increases the complexity, time, and cost of manufacturing the circuit. The VCO 40a may e.g. be an LC-tank VCO. A further advantage with selecting a relatively high center frequency (e.g. 4 GHz or higher as described above) compared with a lower center frequency is that the required circuit area for inductors in the LC tank is reduced.

Furthermore, according to the embodiment illustrated in FIG. 1, the PLL circuit 1a comprises a programmable frequency divider 50 having an input terminal 52, a control terminal 54, and an output terminal 56. The input terminal 52 is operatively connected to the output terminal 44 of the VCO 40a. The programmable frequency divider is arranged to generate the pixel-clock signal on the output terminal 56 by frequency division of the oscillating signal with a first frequency divisor. The value of the first frequency divisor may be controlled or programmed via the control terminal 54. The value of the first frequency divisor may e.g. be set based on configuration data for a current screen configuration of a device, such as a video device, comprising the PLL 1a. The configuration data may comprise or indicate a pixel rate (e.g. defined in terms of number of pixels per second). Alternatively or additionally, the configuration data may comprise or indicate a screen resolution and/or a refresh rate of said device. The frequency divisor may additionally be based on data regarding the tuning range of the VCO 40a. The data may e.g. comprise the center frequency of the tuning range of the VCO 40a and/or other frequency value(s) within the tuning range of the VCO 40a. Based on said data and the configuration data, a suitable value for the first frequency divisor may be selected such that the target frequency of the pixel-clock signal multiplied with the first frequency divisor falls inside the tuning range of the VCO.

Using a VCO 40a with a relatively high center frequency has the benefit of relatively low jitter, but the tuning range of the VCO 40a is limited. However, in combination with the programmable frequency divider 50, an overall large tuning range for the whole PLL circuit 1a is obtained. As a result, a PLL circuit capable of fulfilling the requirements of relatively low jitter, which is needed due to the relatively large frequency difference between the hsync signal and the pixel-clock signal, and relatively large tuning range, which is needed e.g. to provide flexibility in supported screen resolutions, is obtained. Furthermore, such a PLL circuit can be obtained using a single VCO, which is an advantage.

Moreover, according to the embodiment illustrated in FIG. 1, the PLL circuit comprises another programmable frequency divider 60 having an input terminal 62, a control terminal 64, and an output terminal 66. The input terminal 62 is operatively connected to the output terminal 56 of the programmable frequency divider 50. The output terminal 66 is operatively connected to the input terminal 14 of the PFD 10. The programmable frequency divider 60 is arranged to generate the frequency divided pixel-clock signal by frequency division of the pixel-clock signal with a second frequency divisor. The value of the second frequency divisor may be controlled or programmed via the control terminal 64. The value of the second frequency divisor may e.g. be set based on the configuration data for the current screen configuration.

As illustrated in FIG. 1, the PLL circuit 1a may comprise a control unit 70 adapted to supply control signals to the programmable frequency dividers 50 and 60 for controlling the values of the first and the second frequency divisors. According to the embodiment illustrated in FIG. 1, the control unit 70 has an input terminal 72 for receiving configuration data. Furthermore, the control unit has an output terminal 74 operatively connected to the control terminal 54 of the programmable frequency divider 50 and an output terminal 76 operatively connected to the control terminal 64 of the programmable frequency divider 60. According to some embodiments, the PLL circuit 1a is adapted to support a plurality of predefined configurations, wherein a configuration e.g. may be defined by a combination of a screen resolution and a refresh rate. The configuration data supplied to the control unit 70 may e.g. be a number or other label that identifies a specific supported configuration. The control unit 70 may comprise a memory unit (not shown), e.g. a programmable memory unit or a read-only memory (ROM) unit. The memory unit may be adapted to store a look-up table with suitable values for the first and second frequency divisors. The control unit 70 may be adapted to retrieve values for the first and second frequency divisors from the memory unit based on the configuration data and supply to the programmable frequency dividers 50 and 60.

Figure 2:
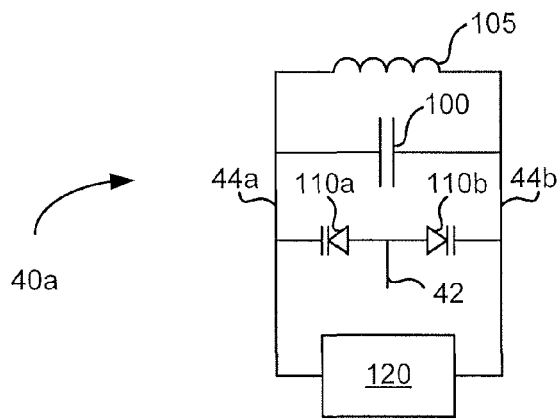
FIG. 2 is a circuit diagram of a voltage-controlled oscillator according to an embodiment.

FIG. 2 is a simplified schematic circuit diagram of an embodiment of the VCO 40a. The embodiment illustrated in FIG. 2 has a differential structure with output terminals 44a and 44b. With reference to FIG. 1, the output terminal 44 of the VCO 40a may be a differential output terminal comprising the terminals 44a and 44b of the embodiment illustrated in FIG. 2. Alternatively, any one of the terminals 44a and 44b may be used as a single-ended output terminal of the VCO 40a.

According to the embodiment illustrated in FIG. 2, the VCO 40a comprises a capacitor 100. Furthermore, the VCO 40a comprises an inductor 105 connected in parallel with the capacitor 100. As illustrated in FIG. 2, the VCO 40a may comprise one or more varactor diodes that are controlled with a voltage supplied via the control terminal 42 of the VCO 40a. In the embodiment illustrated in FIG. 2, the VCO 40a comprises two varactor diodes 110a and 110b connected with their anode terminals to the control terminal 42 of the VCO 40a and in a branch parallel with the capacitor 100 and the inductor 105. The inductor 105, capacitor 100, and varactor diodes 110a and 110h form a parallel resonance circuit. Moreover, according to the embodiment illustrated in FIG. 2, the VCO 40a comprises an active element 120. The active element 120 is arranged to supply energy to the resonance circuit, e.g. from a power-supply source, in order to compensate for energy losses in the resonance circuit, e.g. due to parasitic resistive elements in the VCO 40a. According to an example embodiment, the active element 120 comprises a pair of back-to-back connected inverters (not shown) connected between the terminals 44a and 44b.

By adjusting the voltage at the terminal 42, the capacitance values of the varactor diodes 110a and 110b are also adjusted. Thereby, the total capacitance of the parallel connection of the capacitor 100 and the branch comprising the varactor diodes 110a and 110b is also adjusted. As a consequence, the resonance frequency of the parallel resonance circuit, and thereby the frequency of the oscillating signal, is adjusted. Hence, the varactor diodes 110a and 110b are responsive to the frequency control signal for adjusting the frequency of the oscillating signal.

The embodiment illustrated in FIG. 2 is only an example. Other circuit topologies of LC-tank VCOs are known and may be utilized for the VCO 40a (FIG. 1). Such VCO topologies may e.g. comprise one or more varactor diodes that are responsive to the frequency-control signal for adjusting the frequency of the oscillating signal, similar to the embodiment illustrated in FIG. 2.

Figure 3:
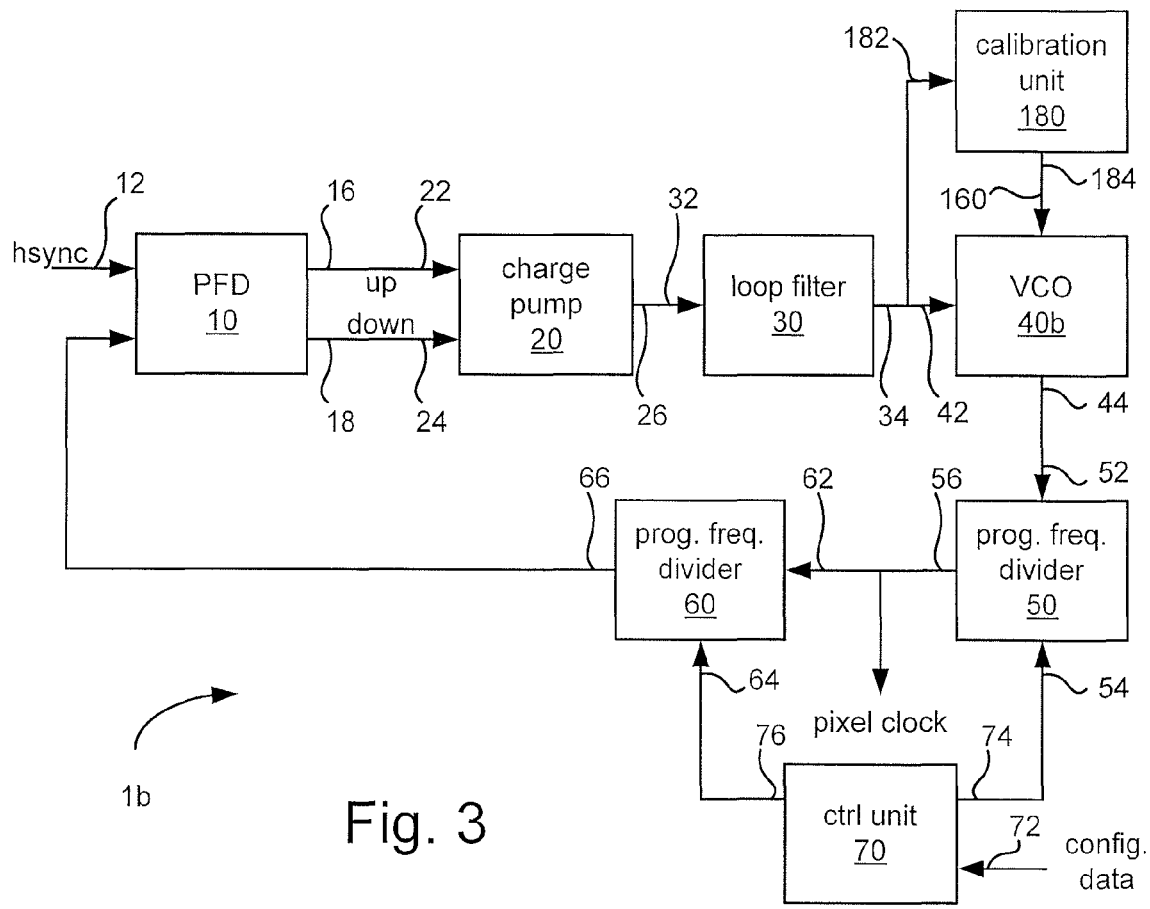
FIG. 3 is a block diagram of a phase-locked loop circuit according to an embodiment.

Due to fabrication inaccuracies, component parameters, such as the inductance of an inductor, the capacitance of a capacitor, etc. will normally deviate from the nominal component parameter values intended during design of a circuit. Furthermore, component parameters may vary in time, e.g. due to aging and temperature variations. FIG. 3 is a block diagram of a PLL circuit 1b according to an embodiment, wherein calibration of the VCO tuning range for compensation of component parameter variation is facilitated. Units and terminals in FIG. 3 that correspond to units and terminals in FIG. 1 are denoted with the same reference signs, and are not further described in the context of FIG. 3.

The PLL circuit 1b illustrated in FIG. 3 comprises a VCO 40b, which is arranged and adapted similar to the VCO 40a in FIG. 1. According to embodiments, a relatively high Q value for the VCO 40b is obtained by means of a center frequency, which is significantly higher than the pixel-clock frequency. According to some embodiments, the center frequency is 4 GHz or higher. In addition to the control terminal 42 and output terminal 44, which are the same as for the VCO 40a in FIG. 1, the VCO 40b has a calibration terminal 160. The VCO 40b is arranged to receive a calibration signal on the calibration terminal 160. Furthermore, the VCO 40b is adapted to adjust its tuning range based on the calibration signal. According to some embodiments, adjusting the tuning range includes adjusting the center frequency of the tuning range.

According to the embodiment illustrated in FIG. 3, the PLL circuit 1b further comprises a calibration unit 180 having an input terminal 182 and an output terminal 184. The output terminal 184 is operatively connected to the calibration terminal 160 of the VCO 40b for supplying the calibration signal to the VCO 40b. The calibration unit 180 may be adapted to generate the calibration signal based on the frequency-control signal input to the VCO 40b on the control terminal 42. This is indicated in FIG. 3, wherein the input terminal 172 of the calibration unit is connected to the control terminal 42 of the VCO 40b.

According to an embodiment, the calibration unit 180 may be adapted to compare the frequency-control signal with a first threshold value and a second threshold value, which is larger than the first threshold value. The calibration unit 180 may be adapted to determine that a target frequency of the VCO 40b, i.e. the frequency to which the PLL circuit 1b tries to drive the VCO 40b, is below the tuning range of the VCO 40b in response to detecting that the frequency-control signal is below the threshold value. Furthermore, the calibration unit 180 may be adapted to determine that the target frequency of the VCO 40b is above the tuning range of the VCO 40b in response to detecting that the frequency-control signal exceeds the second threshold value.

The calibration unit 180 may be adapted to generate a calibration signal for decreasing the center frequency of the tuning range of the VCO 40b in response to detecting that the frequency-control signal is below the first threshold value. Furthermore, the calibration unit 180 may be adapted to generate a calibration signal for increasing the center frequency of the tuning range of the VCO 40b in response to detecting that the frequency-control signal exceeds the second threshold value.

According to some embodiments, the calibration signal is updated once for each pulse or period of the hsync signal. According to other embodiments, the calibration signal is updated less frequently, e.g. once for every second, third, fourth, fifth etc. pulse of the hsync signal.

Figure 4:
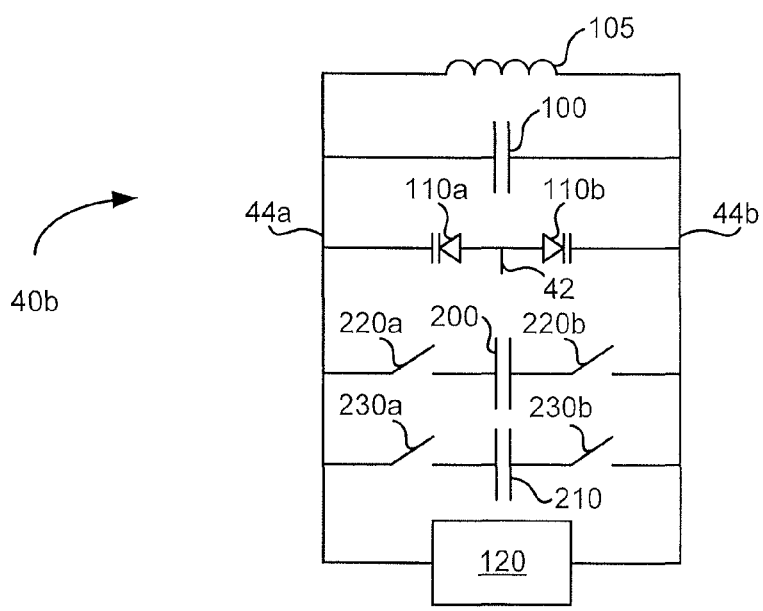
FIG. 4 is a circuit diagram of a voltage-controlled oscillator according to an embodiment.

FIG. 4 is a simplified schematic circuit diagram of an embodiment of the VCO 40b. Similar to the embodiment of the VCO 40a illustrated in FIG. 2, the embodiment of the VCO 40b illustrated in FIG. 4 comprises a capacitor 100, an inductor 105, varactor diodes 110a and 110b, and an active element 120. The functions of these elements are the same as in the embodiment of FIG. 2 and are not further described. In addition, the VCO 40b comprises one or more switchable capacitors 200, 210. Each of the one or more switchable capacitors 200, 210 may be selectively connected between the terminals 44a and 44b based on the calibration signal. For example, the capacitor 200 may be connected between the terminals 44a and 44b by closing the switches 220a and 220b. The capacitor 200 may be disconnected from the terminals 44a and 44b by opening the switches 220a and 220b. Similarly, the capacitor 210 may be connected between the terminals 44a and 44b by closing the switches 230a and 230b. The capacitor 210 may be disconnected from the terminals 44a and 44b by opening the switches 230a and 230b.

In FIG. 4, the number of switchable capacitors is two. However, this is only an example. According to various other embodiments, any number of switchable capacitors may be used.

The calibration signal may be a digital signal. The number of bits in the calibration signal may be equal to the number of switchable capacitors in the VCO 40b. Each of the bits in calibration signal may be assigned to control switches associated with a unique one of the switchable capacitors. For example, a switch may be arranged to be closed when the corresponding bit in the calibration signal is '1' and open when the bit is '0'. Alternatively, a switch may be arranged to be closed when the corresponding bit in the calibration signal is '1' and open when the bit is '0'.

The switches may be implemented with transistors, such as but not limited to MOS transistors. A switch may e.g. be implemented with an NMOS transistor, a PMOS transistor, or a transmission gate comprising an NMOS transistor connected in parallel with a PMOS transistor.

According to some embodiments, the switchable capacitors may be unary weighted, i.e. each of the switchable capacitors may be designed to have the same capacitance $C_0$. The calibration signal may then have a thermometer-coded representation. According to some embodiments, the switchable capacitors may be binary weighted, i.e. the switchable capacitors may be designed to have capacitance values $C_0$, $2C_0$, $4C_0$, $8C_0$, etc. Then, the calibration signal may have a binary representation. The least significant bit (LSB) of the calibration signal may be assigned to control switches associated with the switchable capacitor with the capacitance $C_0$, the bit with second lowest significance may be assigned to control switches associated with the switchable capacitor having the capacitance $2C_0$, etc. Other alternatives, such as but not limited to a segmented architecture, wherein some of the switchable capacitors are unary weighted and some of the switchable capacitors are binary weighted, may also be used.

According to some embodiments, the calibration unit 180 is adapted to adjust the calibration signal in such a way that the total capacitance of the switchable capacitors that are connected to the terminals 44a and 44b increases in response to detecting that the frequency-control signal is below the first threshold value. For example, with reference to the examples above, said total capacitance may be increased with an amount of $C_0$. As a consequence, the center frequency of the tuning range of the VCO 40b decreases.

Furthermore, according to some embodiments, the calibration unit 180 may be adapted to adjust the calibration signal in such a way that the total capacitance of the switchable capacitors that are connected to the terminals 44a and 44b decreases in response to detecting that the frequency-control signal exceeds the second threshold value. For example, with reference to the examples above, said total capacitance may be decreased with an amount of $C_0$. As a consequence, the center frequency of the tuning range of the VCO 40b increases.

The calibration unit 180 may, in some embodiments, additionally or alternatively, be arranged to control the programmable frequency divider 50. This is not illustrated in FIG. 3. For example, if it is determined that the target frequency of the VCO 40b exceeds the tuning range of the VCO 40b, the first frequency divisor may be decreased. This does not alter the tuning range of the VCO 40b. However, the target frequency of the VCO 40b is decreased. Similarly, if it is determined that the target frequency of the VCO 40b is below the tuning range of the VCO 40b, the first frequency divisor may be increased. This does not alter the tuning range of the VCO 40b. However, the target frequency of the VCO 40b is increased. The first frequency divisor may e.g. be the sum of a frequency divisor supplied by the control unit 70, e.g. based on configuration data for a current screen configuration, and a (positive or negative) delta value supplied by the calibration unit 180. The first frequency divisor may e.g. be stepwise increased or decreased until a suitable value of the first frequency divisor has been obtained. Alternatively, a suitable value for the first frequency divisor may be obtained by means of another type of search algorithm, such as a binary search algorithm or the like.

According to some embodiments, a tuning range of the VCO 40a (FIG. 1) or 40b (FIG. 3) comprises the frequency 5 GHz. Furthermore, the programmable frequency divider 50 (FIGS. 1 and 3) may be adapted to be programmed to perform frequency division with even frequency divisors between and including 16 and 370, thereby supporting generation of pixel-clock frequencies in the range 13.5 MHz-300 MHz.

Embodiments of the PLL circuit 1a or 1b described herein may suitably be comprised in a video front-end sampling circuit. The pixel-clock signal may e.g. be utilized as a sampling clock for sampling R (Red), G (Green), and B (Blue) signals.

According to some embodiments, embodiments of the PLL circuit 1a or 1b described herein are comprised in an electronic apparatus. The electronic apparatus may be, but is not limited to, a television set, a liquid-crystal display, a computer monitor, or a projector.

Embodiments of the PLL circuit 1a and 1b may be integrated on an integrated circuit. For embodiments wherein the VCO 40a or 40b is an LC-tank VCO, an advantage of using a relatively high center frequency for the tuning range of the VCO, compared with using a lower center frequency, is that the required circuit area for inductor(s) in the LC tank is normally smaller.

Embodiments have been described above wherein the VCO 40a or 40b is implemented as an LC-tank VCO. Other types of VCOs, such as VCOs comprising tunable transmission-line resonators, may also provide suitable Q values at center frequencies that are significantly higher than the pixel-clock frequency. Such VCOs may also be used in embodiments of the present invention.

The present invention has been described above with reference to specific embodiments. However, other embodiments than the above described are possible within the scope of the invention. The different features of the embodiments may be combined in other combinations than those described. The scope of the invention is only limited by the appended patent claims.

The invention claimed is:

1. A phase-locked loop circuit for generating a pixel-clock signal based on a horizontal synchronization signal, comprising:
   a phase-frequency detector having an input to receive the horizontal synchronization signal and a frequency divided pixel-clock signal, and arranged to generate up and down signals based on the horizontal synchronization signal and the frequency-divided pixel-clock signal;
   a charge pump having an input to receive the up and down signals from the phase-frequency detector, and arranged to generate an output signal based on the up and down signals;
   a loop filter having an input to receive the output signal from the charge pump, and arranged to generate a frequency-control signal based on the output signal of the charge pump;
   a voltage-controlled oscillator having an input to receive the frequency-control signal from the loop filter, and arranged to generate an oscillating signal and adjust a frequency of the oscillating signal in response to the frequency-control signal, wherein the voltage-controlled oscillator is adapted to have a tuning range with a center frequency which is larger than or equal to 4 GHz;
   a programmable first frequency divider having an input to receive the oscillating signal from the voltage-controlled oscillator, and arranged to generate the pixel-clock signal by frequency division of the oscillating signal; and
   a programmable second frequency divider having an input to receive the pixel-clock signal from the programmable first frequency divider, and arranged to generate the frequency divided pixel-clock signal by frequency division of the pixel-clock signal.

2. The phase-locked loop circuit according to claim 1, wherein the voltage-controlled oscillator is an LC-tank voltage-controlled oscillator.

3. The phase-locked loop circuit according to claim 2, wherein the voltage-controlled oscillator comprises a first capacitor, an inductor, and a varactor diode, wherein the varactor diode is responsive to the frequency-control signal for adjusting the frequency of the oscillating signal.

4. The phase-locked loop circuit according to claim 3, wherein the voltage-controlled oscillator comprises one or more switchable capacitors arranged to be selectively connected in parallel with the first capacitor based on a calibration signal for calibrating the tuning range of the voltage-controlled oscillator.

5. The phase-locked loop circuit according to claim 4, further comprising a calibration unit adapted to detect, based on the frequency-control signal, whether a target frequency of the oscillating signal is outside the tuning range of the voltage-controlled oscillator and, in response to the target frequency of the oscillating signal being outside the tuning range of the voltage-controlled oscillator, to generate the calibration signal for calibrating the tuning range of the voltage-controlled oscillator.

6. The phase-locked loop circuit according claim 5, wherein the tuning range of the voltage-controlled oscillator comprises the frequency 5 GHz.

7. The phase-locked loop circuit according to claim 6, wherein the programmable first frequency divider is adapted to be programmed to perform frequency division with even frequency divisors between and including 16 and 370.

8. The phase-locked loop circuit according to claim 7, wherein the phase-locked loop circuit is included in a video front-end sampling circuit.

9. The phase-locked loop circuit according to claim 7, wherein the phase-locked loop circuit is included in an integrated circuit.

10. The phase-locked loop circuit according to claim 7, wherein the phase-locked loop circuit is included in electronic apparatus.

11. The phase-locked loop circuit according to claim 10, wherein the electronic apparatus is a television set, a liquid-crystal display, a computer monitor, or a projector.

12. The phase-locked loop circuit according to claim 1, wherein the voltage-controlled oscillator comprises a first capacitor, an inductor, and a varactor diode, wherein the varactor diode is responsive to the frequency-control signal for adjusting the frequency of the oscillating signal.

13. The phase-locked loop circuit according to claim 12, wherein the voltage-controlled oscillator comprises one or more switchable capacitors arranged to be selectively connected in parallel with the first capacitor based on a calibration signal for calibrating the tuning range of the voltage-controlled oscillator.

14. The phase-locked loop circuit according to claim 13, further comprising a calibration unit adapted to detect, based on the frequency-control signal, whether a target frequency of the oscillating signal is outside the tuning range of the voltage-controlled oscillator and, in response to the target frequency of the oscillating signal being outside the tuning range of the voltage-controlled oscillator, to generate the calibration signal for calibrating the tuning range of the voltage-controlled oscillator.

15. The phase-locked loop circuit according to claim 14, wherein the tuning range of the voltage-controlled oscillator comprises the frequency 5 GHZ.

16. The phase-locked loop circuit according to claim 15, wherein the programmable first frequency divider is adapted to be programmed to perform frequency division with even frequency divisors between and including 16 and 370.

17. The phase-locked loop circuit according to claim 1, further comprising a calibration unit adapted to detect, based on the frequency-control signal, whether a target frequency of the oscillating signal is outside the tuning range of the voltage-controlled oscillator and, in response to the target frequency of the oscillating signal being outside the tuning range of the voltage-controlled oscillator, to generate the calibration signal for calibrating the tuning range of the voltage-controlled oscillator.

18. The phase-locked loop circuit according to claim 17, wherein the tuning range of the voltage-controlled oscillator comprises the frequency 5 GHZ.

19. The phase-locked loop circuit according to claim 17, wherein the programmable first frequency divider is adapted to be programmed to perform frequency division with even frequency divisors between and including 16 and 370.

20. The phase-locked loop circuit according to claim 19, wherein the phase-locked loop circuit is included in a video front-end sampling circuit of a television set, a liquid-crystal display, a computer monitor, or a projector.

\* \* \* \* \*

UNITED STATES PATENT AND TRADEMARK OFFICE
CERTIFICATE OF CORRECTION

| | |
|---|---|
| PATENT NO. | : 8,576,970 B2 |
| APPLICATION NO. | : 13/063286 |
| DATED | : November 5, 2013 |
| INVENTOR(S) | : Graham R. Leach et al. |

It is certified that error appears in the above-identified patent and that said Letters Patent is hereby corrected as shown below:

In the Specification:

In Column 6, Line 15, delete "110h", and insert -- 110b -- therefor.

Signed and Sealed this
Fourth Day of February, 2014

Michelle K. Lee
*Deputy Director of the United States Patent and Trademark Office*